United States Patent [19]
Chen et al.

[11] Patent Number: 6,097,992
[45] Date of Patent: Aug. 1, 2000

[54] METHOD AND CONTROLLING SYSTEM FOR PREVENTING THE SCRATCHING OF WAFER BACKS BY THE FETCH ARM OF A STEPPER MACHINE

[75] Inventors: Tien-Ya Chen, Chupei; Chen-Chiu Tseng, Hsinchu Hsien, both of Taiwan

[73] Assignee: United Semiconductor Corp., Hsinchu, Taiwan

[21] Appl. No.: 08/991,187

[22] Filed: Dec. 16, 1997

[30] Foreign Application Priority Data

Sep. 1, 1997 [TW] Taiwan ................................. 86112506

[51] Int. Cl.⁷ ....................................................... G06F 19/00
[52] U.S. Cl. ........................ 700/106; 700/104; 700/108; 700/110; 700/112; 700/213; 700/214; 414/243; 414/270; 414/729; 414/739
[58] Field of Search ............................... 700/95, 96, 104, 700/105, 106, 107, 108, 109–114, 213, 214; 414/243, 270, 729, 739

[56] References Cited

U.S. PATENT DOCUMENTS

| | | | |
|---|---|---|---|
| 4,634,331 | 1/1987 | Hertel | 414/217 |
| 4,770,590 | 9/1988 | Hugues et al. | 414/172 |
| 5,171,393 | 12/1992 | Moffat | 156/345 |
| 5,295,777 | 3/1994 | Hodos | 414/217 |
| 5,359,785 | 11/1994 | Fukutomi et al. | 34/60 |
| 5,380,682 | 1/1995 | Edwards et al. | 438/800 |
| 5,399,531 | 3/1995 | Wu | 364/468.19 |
| 5,486,080 | 1/1996 | Sieradzki | 414/217 |
| 5,511,005 | 4/1996 | Abbe et al. | 702/84 |
| 5,540,098 | 7/1996 | Ohsawa | 73/629 |

*Primary Examiner*—Paul P. Gordon
*Assistant Examiner*—Ramesh Patel
*Attorney, Agent, or Firm*—Finnegan, Henderson, Farabow, Garrett & Dunner, L.L.P.

[57] ABSTRACT

A method for avoiding scratching of wafer backs being held by a vacuum to a fetch arm of a stepper machine for insertion into a cassette holder includes releasing the vacuum in the suction head of the fetch are before the wafer enters the cassette holder. The release of vacuum reduces frictional force between the wafer back and the suction head when the wafer accidentally hits the side of the cassette holder. Therefore, the vacuum release method avoids scratching of wafer backs by the suction head of the fetch arm. The invention requires a separate vacuum release controller to release the vacuum in the suction head for a prescribed delaying period after the fetch arm starts moving toward the cassette holder.

10 Claims, 7 Drawing Sheets

FIG. 7

METHOD AND CONTROLLING SYSTEM FOR PREVENTING THE SCRATCHING OF WAFER BACKS BY THE FETCH ARM OF A STEPPER MACHINE

BACKGROUND OF THE INVENTION

1. Field of Invention

The present invention relates to an installation in a stepper machine for microlithographic processing of semiconductors. More particularly, the present invention relates to a method and a controlling system for preventing the scratching of wafer backs by the fetch arm of a stepper machine.

2. Description of Related Art

Figure 1:
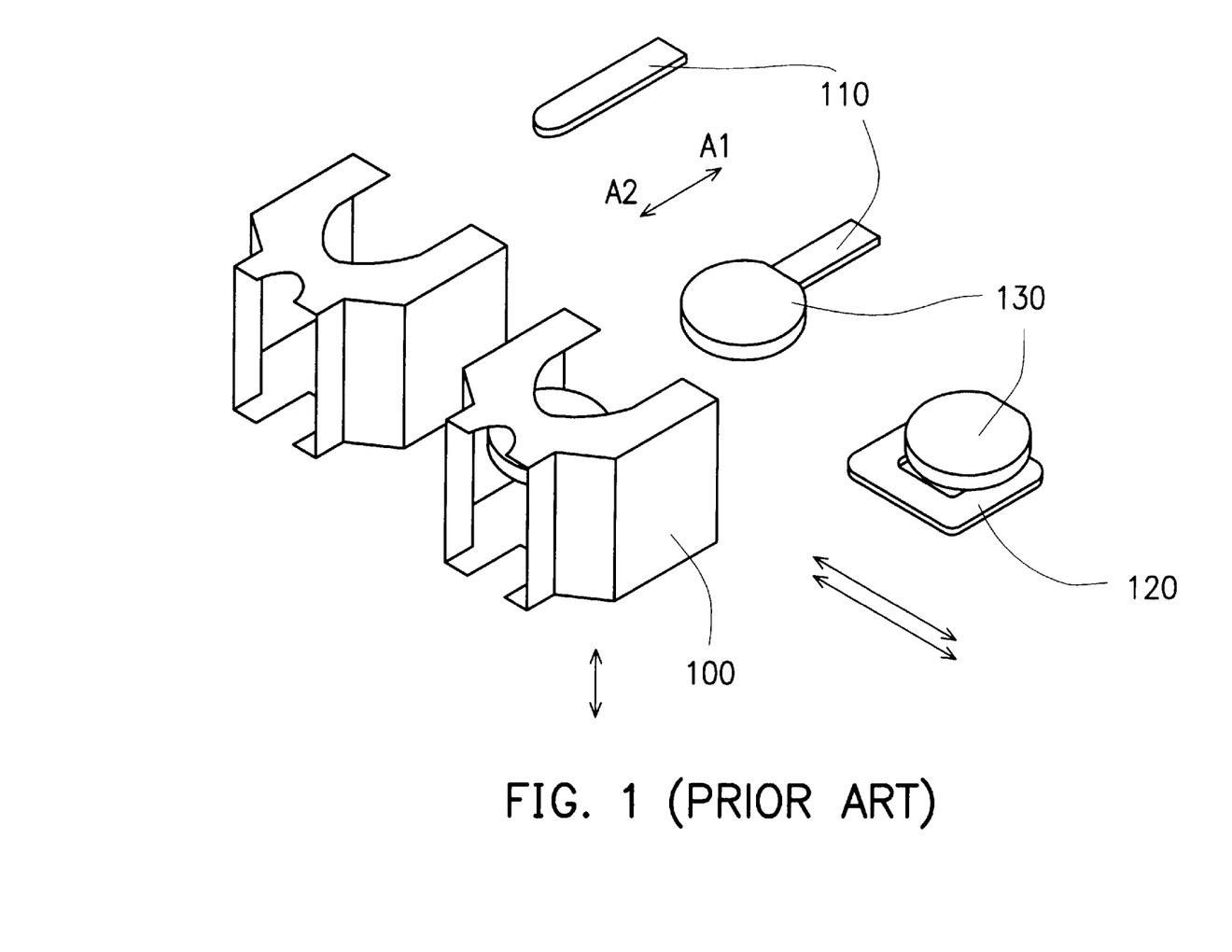
FIG. 1 is a perspective view of wafer holders and part of the structural components of the transporting system of a conventional stepper.

FIG. 1 shows wafer holders and part of the structural components of the transporting system of a conventional stepper. The suction head of a fetch arm 110 picks up a wafer 130 on the side sliding arm 120, transports it to a cassette holder 100, and then unloads the wafer 130. All through the transportation, the wafer 130 is held by a vacuum in the suction head, until the wafer has dropped inside the cassette holder 100.

For the above transporting system, there is one major drawback. As the fetch arm 110 moves from position A1 to A2 toward the cassette holder 100, there is a possibility that the wafer 130 may hit the side of the cassette holder 100, causing the wafer 130 to be slightly displaced from the fetch arm 110. Therefore, the contacting area between the back of the wafer and the suction head may be scratched.

Figure 2:
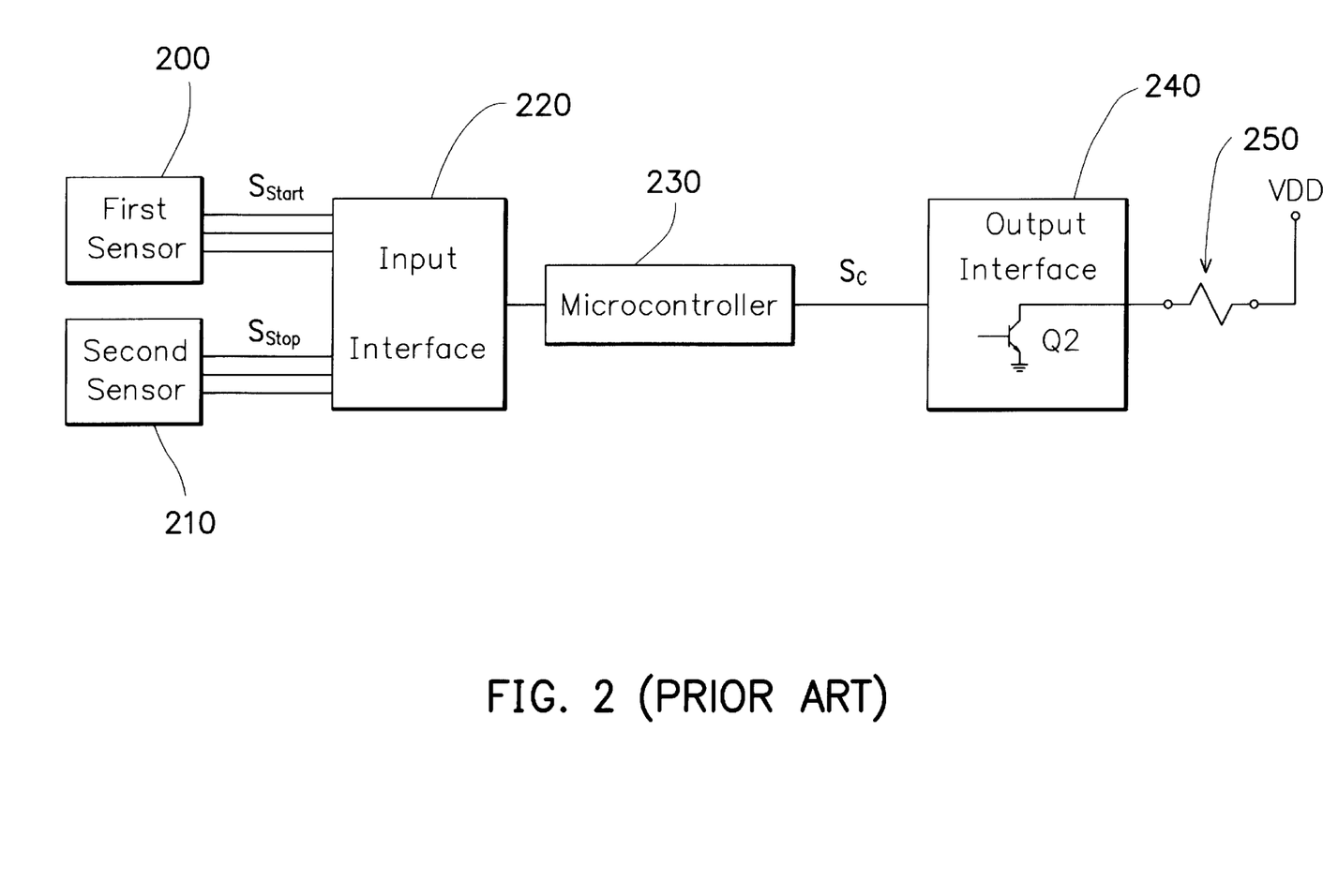
FIG. 2 is a block diagram of a controlling circuit for controlling the movement of the fetch arm of a conventional stepper.
Figure 3:
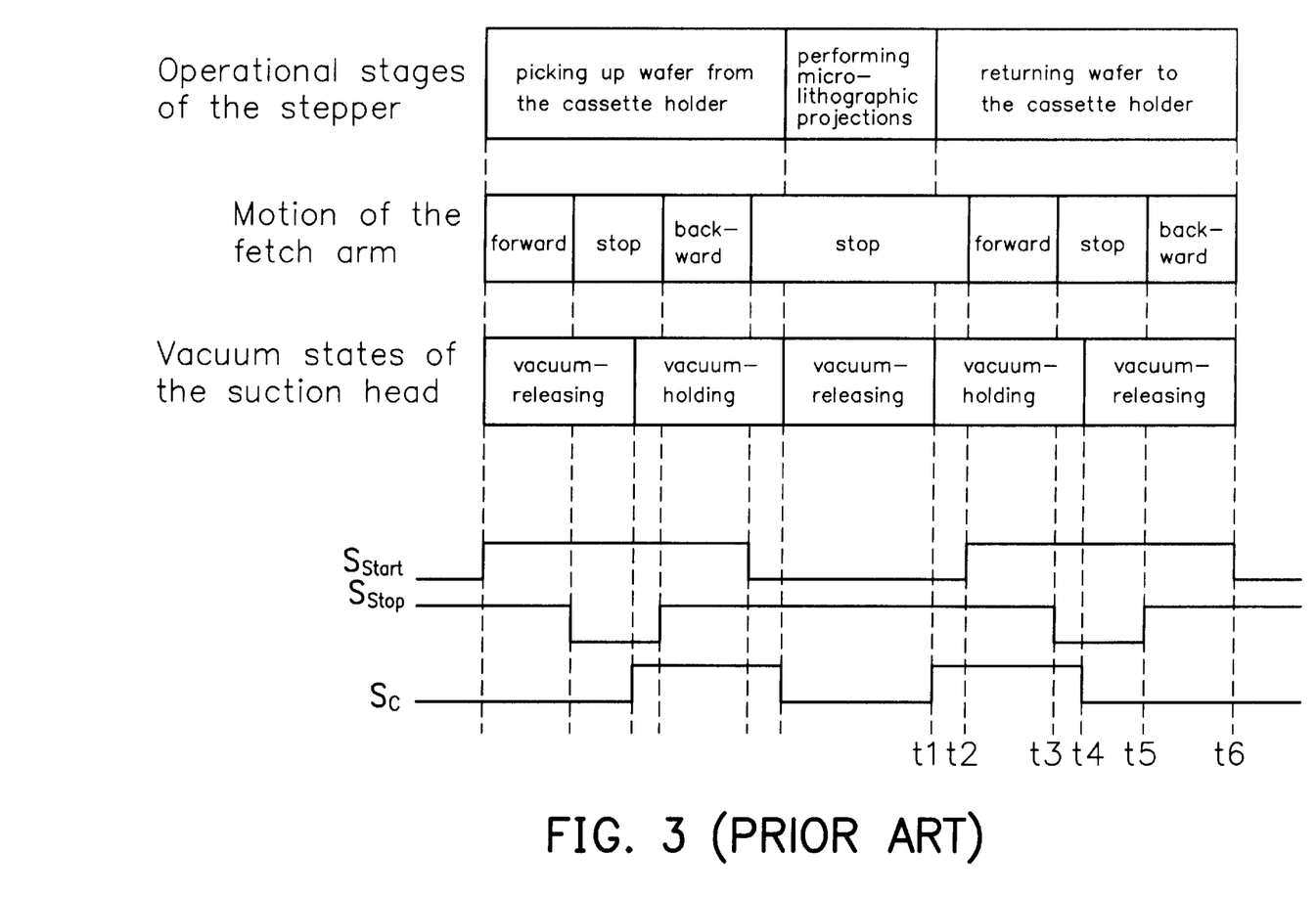
FIG. 3 is time diagram for the sequence of actions associated with movement of fetch arm of a conventional stepper.

FIG. 2 is a block diagram of a controlling circuit for controlling the movement of the fetch arm of a conventional stepper. FIG. 3 is a time diagram for the sequence of actions associated with the movement of a fetch arm in a conventional stepper.

As shown in FIG. 3, the operation of a stepper is roughly divided into three operational stages, namely, picking up a wafer from a cassette holder, performing some microlithographic projections, and returning the wafer to the cassette holder. The fetch arm has three action states, namely, a forward state, a retracting state and a stationery state. The suction head of a fetch arm has two states, namely, a vacuum-release state (a non-vacuum state) and a vacuum-hold state (a vacuum state).

Microlithographic projections may also include other subsidiary steps. Since these steps are not a major concern of this invention, detailed description of their operations is omitted. The relevant issues of this invention are the operation of unloading wafers from the cassette holder to the stepper and returning the wafers from the stepper back to the cassette holder. In particular, the main concern is the operation of returning the wafers to the cassette holder because here is when the wafer back may be scratched. Therefore, controlling actions related to the returning of wafers to the cassette holder are described in detail below with reference to FIGS. 1–3.

The fetch arm controlling system of a conventional stepper includes a first sensor 200, a second sensor 210, an input interface 220, a microcontroller 230, an output interface 240 and a vacuum solenoid valve 250.

The first sensor 200 and the second sensor 210 are used for sensing the position of the fetch arm 110. The first sensor 200 senses whether the fetch arm 110 is in position A1, then generates a first sensor signal $S_{start}$ accordingly. If the fetch arm 110 is in position A1, a logic high output signal will be generated. On the other hand, if the fetch arm 110 is not in position A1, a logic low output signal will be generated. For example, at time t2, the fetch arm 110 starts to move away from position A1, a logic high signal appears in $S_{start}$, and at time t6, the fetch arm 110 has returned to position A1, so a logic low signal reappears in $S_{start}$.

The second sensor 210 senses whether the fetch arm 110 is in position A2, then generates a second sensor signal $S_{stop}$ accordingly. If the fetch arm 110 is in position A2, a logic low output signal will be generated. On the other hand, if the fetch arm 110 is not in position A2, a logic high output signal will be generated. For example, at time t3, the fetch arm 110 has moved to position A2, a logic low appears in Sstop; and at time t5, the fetch arm 110 starts moving away from position A2, so a logic high reappears in $S_{stop}$.

As shown in FIG. 2, the microcontroller 230 is a device for receiving the first sensor signal $S_{start}$, and the second sensor signal $S_{stop}$, and then outputting a first control signal $S_c$. The first control signal $S_c$ controls the opening or closing of the vacuum solenoid valve 250. The vacuum solenoid valve 250 in turn controls the action of releasing the vacuum or holding the vacuum in the suction head of the fetch arm 110.

FIG. 3 illustrates the steps involved in returning a wafer 130 to a cassette holder 100. First, at time t1, a vacuum is created in the suction head of the fetch arm 110 before the fetch arm starts moving away from position A1 at time t2. At time t3, the fetch arm arrives at position A2 and stops. At time t4, the vacuum in the suction head is released. Hence, during the period from time t1 to t4, the suction head of the fetch arm 110 is in a vacuum state. In other words, wafer 130 is held firmly by the suction head of the fetch arm all through its forward journey. A major drawback for this controlling system is that, should the wafer 130 hit the side of the cassette holder 100 during the forward journey of the fetch arm from position A1 to A2, the wafer 130 may be forced to displace slightly. If the wafer is free to move, there will be no problem. However, since the wafer is held firmly by the suction head through a vacuum, the contacting area between the back of wafer and the suction head may be scratched.

In light of the foregoing, there is a need in the art for preventing the scratching of wafer backs by the fetch arm of a stepper.

SUMMARY OF THE INVENTION

Accordingly, the present invention is directed to improving the operation of the fetch arm of a conventional stepper by avoiding the scratching of wafer backs during the transportation of wafers from the stepper to the cassette holders. In another aspect, this invention is directed to providing a controlling system for controlling the operation of the fetch arm that avoids the scratching of wafer backs during the transportation of the wafers from the stepper to the cassette holders.

To achieve these and other advantages and in accordance with the invention, as embodied and broadly described herein, the invention provides a method for preventing the scratching of wafer backs by the fetch arm of a stepper when the wafers are loaded into cassette holders. The main characteristic of this method is that, before the wafer enters the cassette holder, the vacuum in the suction head is released. The release of vacuum reduces frictional force between the wafer back and the suction head due to a wafer shock when there is an accidental impact of the wafer with the side of the cassette holder. Thus, scratching of wafer backs by the suction head of a fetch arm is avoided.

In another aspect, the invention provides a method for preventing the scratching of wafer backs by a fetch arm of a stepper when the wafers are loaded into a cassette holder. The method comprises the steps of, (a) holding the wafer with the vacuum from a suction head on the fetch arm before the fetch arm starts moving toward the cassette holder, (b) releasing the vacuum that holds the wafer after the fetch arm has moved forward a prescribed period but before the wafer enters the cassette holder, and (c) stopping the fetch arm once the wafer has entered the cassette holder.

In another aspect, the invention provides a controlling system for preventing the scratching of wafer backs being inserted into a cassette holder and held by a vacuum in a suction head of a fetch arm. The controlling system comprises multiple sensors for determining the position of the fetch arm and outputting corresponding signals to a microcontroller connected to a vacuum release controller which provides a signal to a vacuum solenoid valve so that the vacuum in the suction head is released just prior to insertion of the wafer into the cassette holder.

According to one preferred embodiment of this invention, the vacuum release controller comprises a first signal delaying circuit for delaying a rising edge of an input signal from a first sensor for a first prescribed period before outputting a first delayed signal, which first sensor detects a first position of the fetch arm. The vacuum release controller also comprises a second signal delaying circuit for delaying a falling edge of an input signal from a second sensor for a second prescribed period before outputting a second delayed signal, which second sensor detects a second position of the fetch arm. In addition, the vacuum release controller includes a timing control circuit coupled to the first and second signal delaying circuits for receiving the first and second delayed signals to generate a second control signal. The vacuum release controller further includes an opto-isolated electronic switching circuit coupled to the timing control circuit and the vacuum solenoid valve, for receiving the second control signal and a first control signal generated by the microcontroller to control the vacuum solenoid valve, thereby controlling the sequence of vacuum releasing and vacuum holding actions in the suction head of a fetch arm. The second control signal releases the vacuum from the end of the first prescribed period when the fetch arm starts moving away from the first position until the end of the second prescribed period when the fetch arm arrives in the second position.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the preferred embodiments of the invention, examples of which are illustrated in the accompanying drawings. Wherever possible, the same reference numbers are used in the drawings and the description to refer to the same or like parts.

The present invention is directed to providing an improved method for minimizing scratches to the back of wafers during the process of transporting wafers from the stepper to the cassette holders using the fetch arm. Furthermore, a separate vacuum release controller is added for executing the improved method of this invention. During the process of returning a wafer to the cassette holder, the vacuum release controller releases the vacuum in the suction head after the fetch arm has moved forward from its initial position for a prescribed period. Through the vacuum releasing action, should the wafer accidentally hit the cassette holder and be shifted, the wafer back will not be scratched because there is no suction in the contacting area between the wafer and the suction head.

Figure 4:
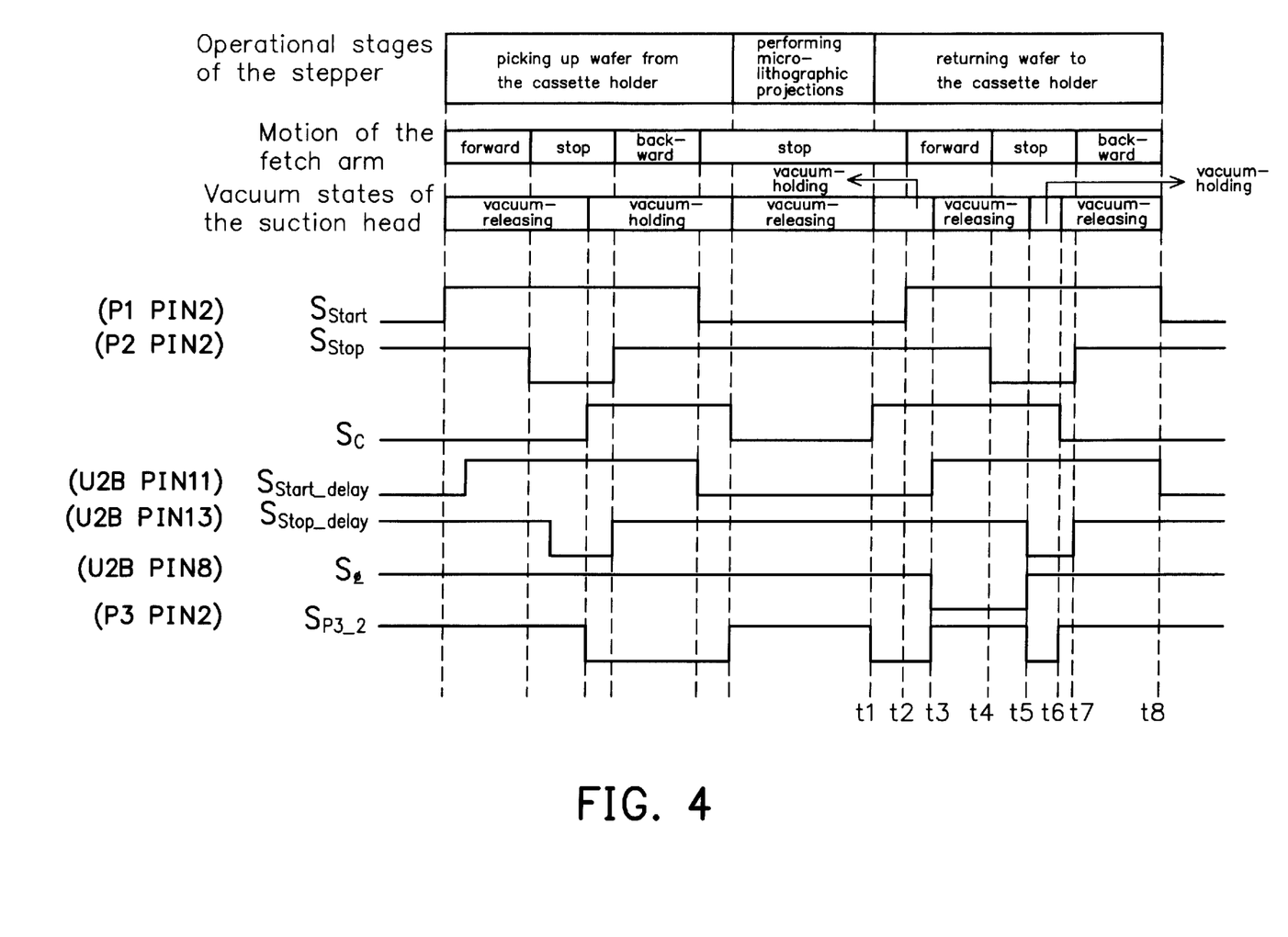
FIG. 4 is a time diagram for the sequence of actions associated with the movement of fetch arm of a stepper according to one preferred embodiment of this invention.

FIG. 4 is a time diagram for the sequence of actions associated with the movement of fetch arm of a stepper according to one preferred embodiment of this invention. The sequence of actions for the fetch arm and the sequence of vacuum states of the suction head is the same as in a conventional design, shown in FIG. 3, for the unloading of the wafer from the cassette holder and the performance of microlithographic projections. In accordance with the invention, the timing of the vacuum-hold and vacuum-release states of the suction head is controlled when the wafers are brought back from the stepper to the cassette holder. The following description explains in detail the controlling mechanism of this invention necessary for transporting the wafers back to the cassette holder.

As shown in FIG. 4, the period starting from time t1 and finishing at time t8 is the period when the activities involved in bringing the wafer 130 back to the cassette holder 100 are carried out. The period when the vacuum holding and vacuum releasing actions are executed is particularly important in accordance with the invention. Refer to FIGS. 1 and 4 for the following description of this period.

(1) At time t1, the fetch arm 110 remains stationery in position A1. A vacuum is formed in the suction head.

(2) At time t2, the fetch arm 110 starts moving from position A1 toward A2. The vacuum in the suction head is maintained.

(3) At time t3, the fetch arm 110 is still on its journey toward position A2, but the wafer 130 is about to enter the cassette holder 100. The vacuum in the suction head is released.

(4) At time t4, the fetch arm 110 has reached position A2 and stopped. The suction head remains at the vacuum-released state.

(5) At time t5, while the fetch arm 110 remains stationery in position A2, a vacuum is formed in the suction head for checking whether the wafer 130 is already inside the cassette holder 100.

(6) At time t6, while the fetch arm 110 remains stationery in position A2, the vacuum in the suction head is released.

(7) At time t7, the fetch arm 110 starts to retract from position A2 toward position A1. The suction head remains at the vacuum-released state. The cassette holder 100 moves up a little to receive the wafer 130.

(8) At time t8, the fetch arm 110 has returned to position A1, thereby completing the operational cycle of putting the wafer 130 back to the cassette holder 100.

The vacuum holding and vacuum releasing actions of this invention described above provides a method for preventing the scratching of wafer backs by the fetch arm of a stepper. The main characteristic of this method is that, before the wafer enters the cassette holder, the vacuum in the suction head is released. The release of vacuum serves to reduce frictional force between the wafer back and the suction head due to a wafer shock when there is an accidental impact of the wafer to the side of the cassette holder. Thus, scratching of wafer backs by the suction head of a fetch arm is prevented.

Figure 5:
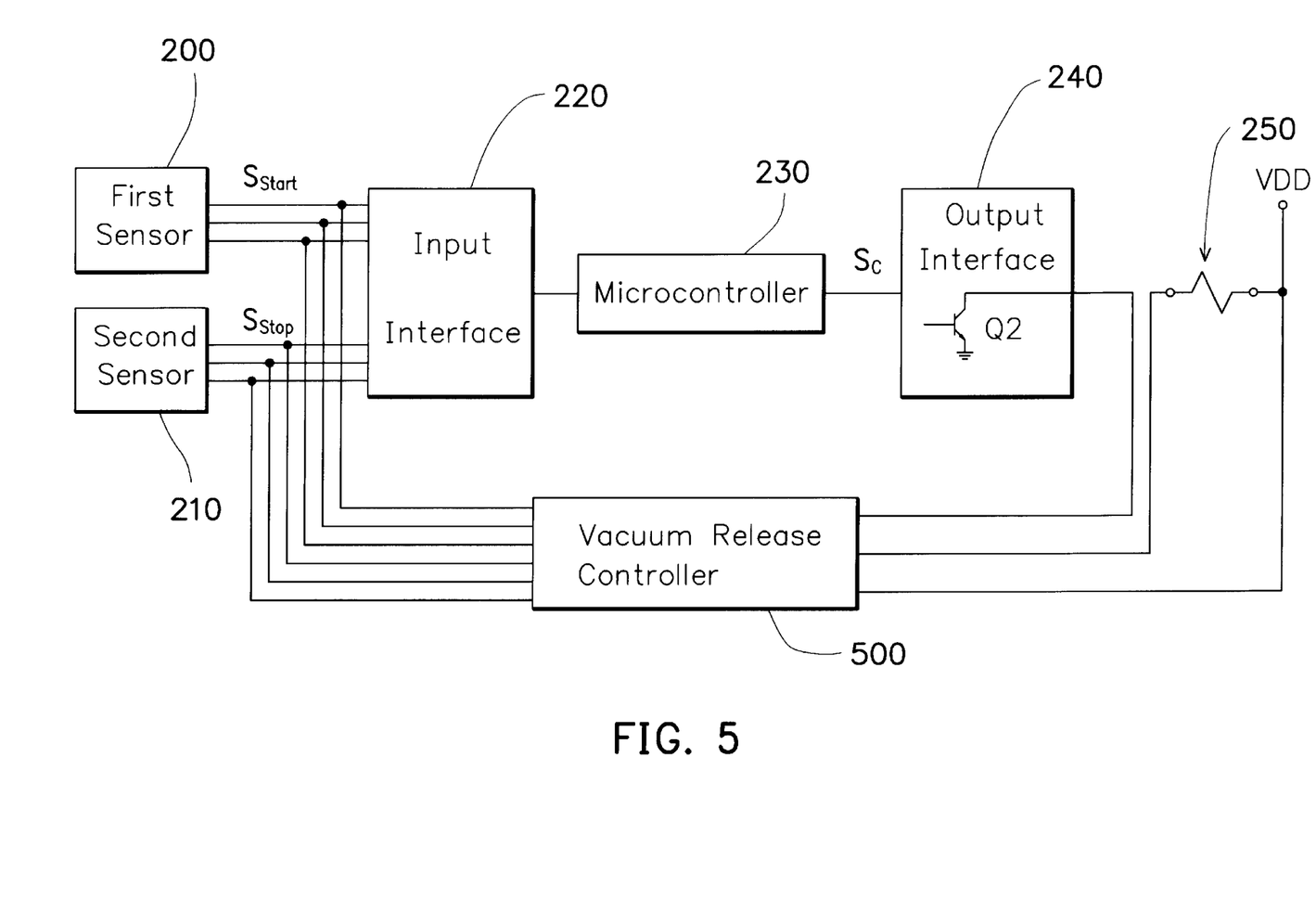
FIG. 5 is a block diagram showing a controlling circuit for controlling the movement of fetch arm of a stepper according to one preferred embodiment of this invention.

FIG. 5 is a block diagram showing a controlling circuit for controlling the movement of fetch arm of a stepper according to one preferred embodiment of this invention. Many of the devices used in the circuit as shown in FIG. 5 are the same as in FIG. 2. For example, the first sensor 200, the second sensor 210, the input interface 220, the microcontroller 230, the output interface 240 and the vacuum solenoid valve 250 are functionally the same as in FIG. 2, and therefore requires no further explanations. The main difference lies in the addition of a vacuum release controller 500 as shown in FIG. 5. After receiving the first sensor signal $S_{start}$ and the second sensor signal $S_{stop}$, the signals are processed in parallel along with the other conventional controlling devices. The vacuum release controller then generates a controlling signal for forcing the release of vacuum in the suction head. Subsequently, this controlling signal together with the conventional first control signal $S_c$ control the opening and the closing of the vacuum solenoid valve 250. Hence, the sequence of actions for releasing or holding a vacuum in the suction head is prescribed.

Figure 6:
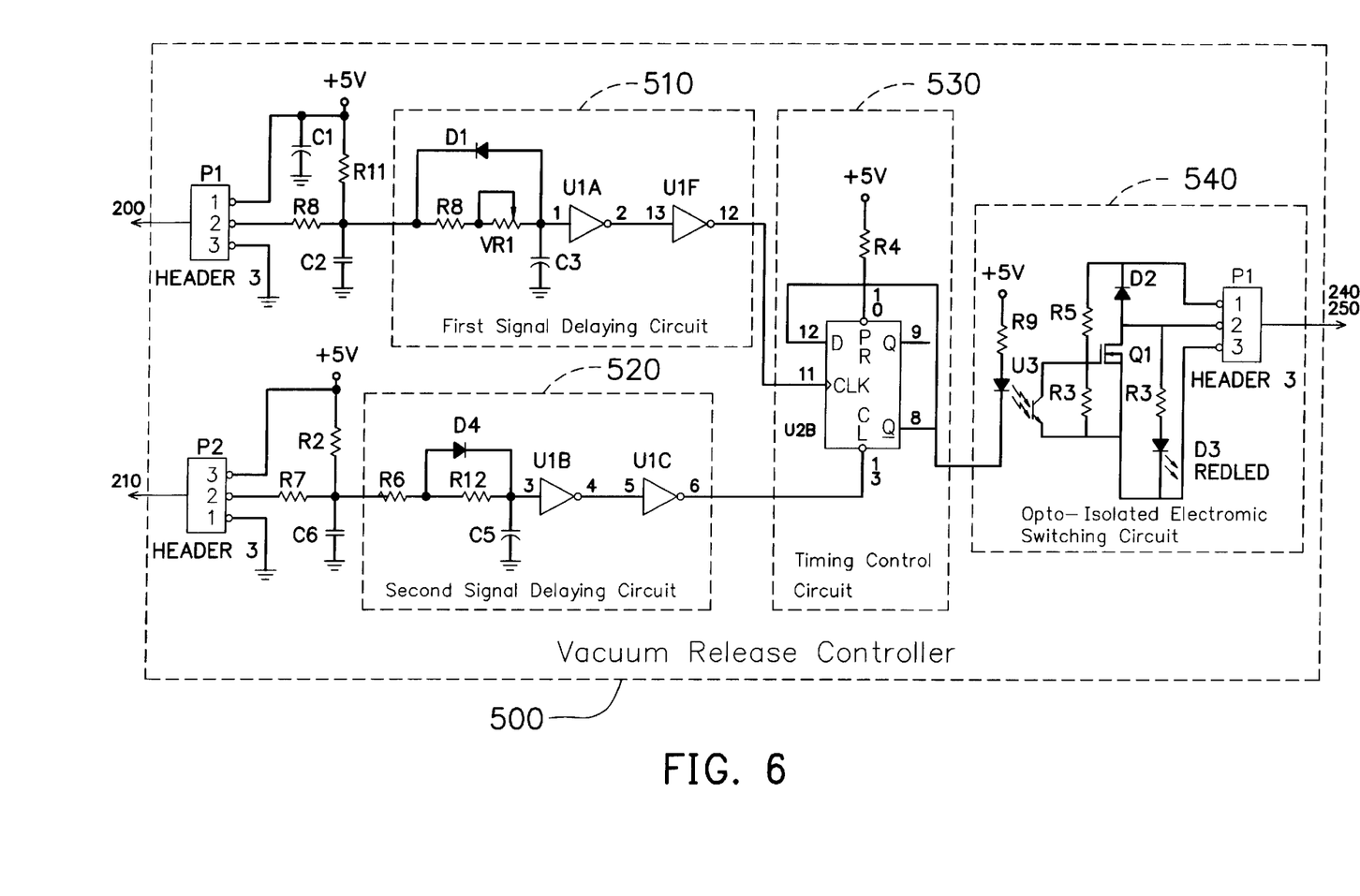
FIG. 6 is a circuit diagram of a vacuum release controller.

FIG. 6 is a circuit diagram of a vacuum release controller 500. The vacuum release controller 500 includes a first signal delaying circuit 510, a second signal delaying circuit 520, a timing control circuit 530 and an opto-isolated electronic switching circuit 540.

The first signal delaying circuit 510 delays the rising edge of the first sensor signal $S_{start}$ from the first sensor 200 for a first prescribed period which is the arithmetic difference between time t3 and t2 as shown in FIG. 4. Therefore, properly delayed signal can be output to match the varying speeds of different fetch arms, and thus ensuring the release of vacuum before the wafer enters the cassette holder.

The second signal delaying circuit 520 delays the falling edge of the second sensor signal $S_{stop}$ from the second sensor 210 for a second prescribed period which is the arithmatic difference between time t5 and t4 as shown in FIG. 4. Therefore, a vacuum release stage will not cease before the fetch arm has stopped at time t4.

The timing control circuit 530 is preferably a D-type flip-flop U2B. The D-type flip-flop uses the output signal $S_{start\_delay}$, as shown in FIG. 4, generated by the first signal delaying circuit 510 as an input clock signal, and uses the output signal $S_{stop\_delay}$ from the second signal delaying circuit 520 as an input clear signal. As shown in FIG. 6, the complementary output terminal Q of the flip-flop is coupled to the input terminal D. Therefore, the timing control circuit 530 works by receiving the output signal $S_{start\_delay}$ from the first signal delaying circuit 510 and the output signal $S_{stop\_delay}$ from the second signal delaying circuit 520 and generating a second control signal $S_Q$ (shown in FIG. 4) for controlling the starting and the length of the vacuum-release stage.

Figure 7:
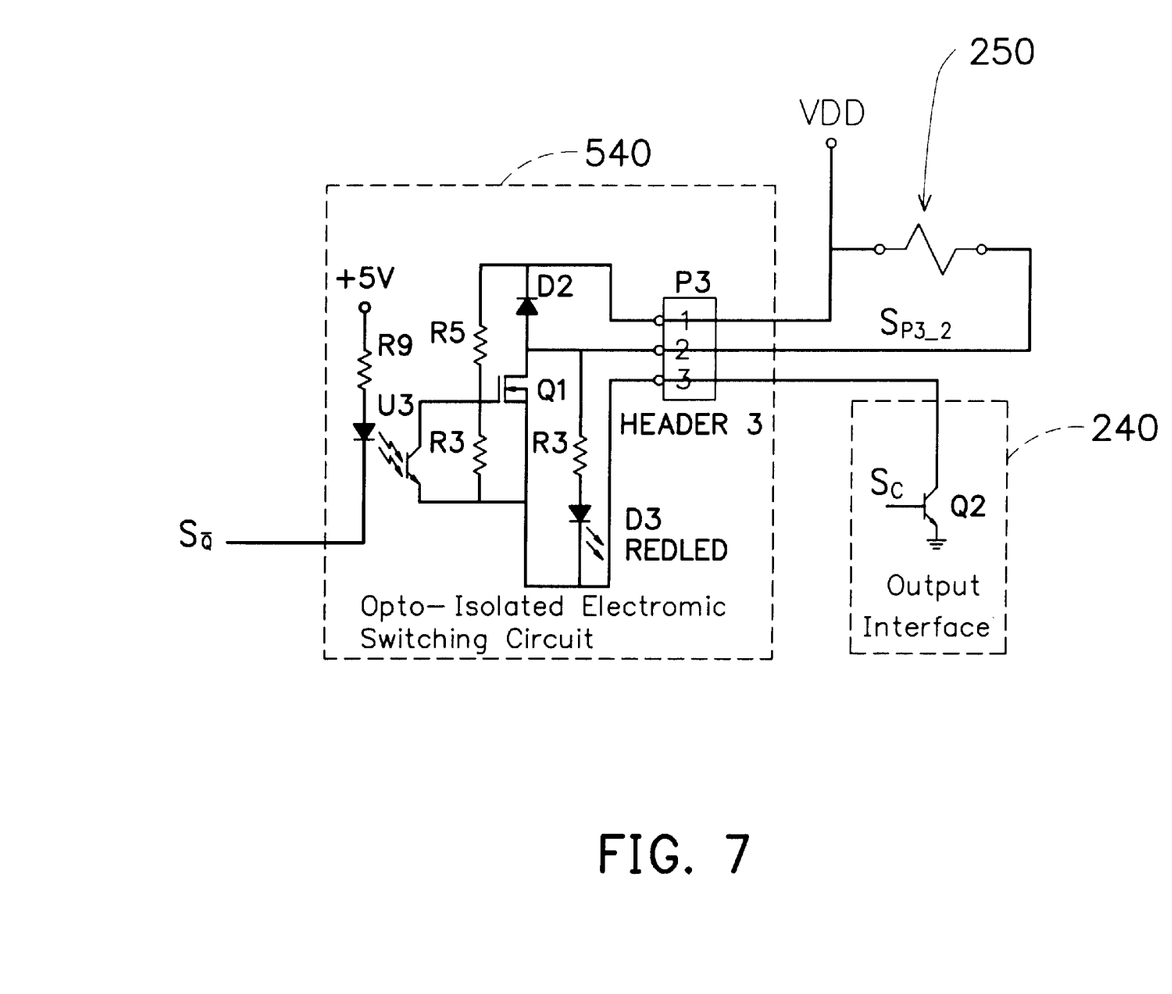
FIG. 7 is a circuit diagram showing an opto-isolated electronic switching circuit, an output interface, a vacuum solenoid valve and their cable connections.

The opto-isolated electronic switching circuit 540 is a contactless switch connected to the output interface 240 and the vacuum solenoid valve 250 of a conventional fetch arm controlling system. FIG. 7 is a circuit diagram showing an opto-isolated electronic switching circuit 540, an output interface 240, a vacuum solenoid valve 250 and their coupling relationship. As shown in FIG. 4, the opto-isolated electronic switching circuit 540 receives the first control signal $S_c$ and the second control signal $S_Q$, then generates an output signal $S_{P3\_2}$ for controlling the opening and closing of the vacuum solenoid valve 250, thereby controlling the vacuum-hold and vacuum-release states of the suction head.

It is clear from the above description of the circuit operation that the first control signal $S_c$ is combined with the second control signal $S_Q$ to determine the vacuum states of the suction head. Using FIG. 4 as a reference, timing control is described in detail below.

(1) Between time t1 to t3, the first control signal $S_c$ is at logic high and the second control signal $S_Q$ is also at logic high. Therefore, signal $S_{P3\_2}$ is at logic low and the suction head is in a vacuum-hold state.

(2) Between time t3 to time t5, the first control signal $S_c$ is at logic high and the second control signal $S_Q$ is at logic low. Therefore, signal $S_{P3\_2}$ is at logic high and the suction head is in a vacuum-release state.

(3) Between time t5 to time t6, the first control signal $S_c$ is at logic high and the second control signal $S_Q$ is at logic high again. Therefore, signal $S_{P3\_2}$ is at logic low and the suction head returns to a vacuum-hold state.

(4) Between time t6 to time t8, the first control signal $S_c$ is at logic low and the second control signal $S_Q$ is at logic high. Therefore, signal $S_{P3\_2}$ is at logic high and the suction head returns to a vacuum-release state.

Thus, the actions that are provided by the first control signal $S_c$ in the present invention are similar to the actions that are provided by the control signal of a conventional controlling system. The main difference is the addition of a second control signal $S_Q$ which carries out the order for releasing the vacuum in the suction head when $S_Q$ is at logic low. Therefore, the design of releasing the vacuum in the suction head before the wafer enters the cassette holder is achieved.

The above description of the preferred embodiments shows that, by adding a vacuum release controller, the design of releasing the vacuum in the suction head before the wafer enters the cassette holder can be achieved. Therefore, in the process of returning a wafer to the cassette holder, should the wafer accidentally hit the cassette holder and get a shock, frictional force in the contacting area between the wafer and the suction head will be minimized, and scratches will not be made. Hence, the present invention not only is favorable to subsequent wafer processing operations, but also can improve production.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A controlling system for preventing the scratching of wafer backs being inserted into a cassette holder and held by a vacuum to a suction head of a fetch arm, comprising:

multiple sensors for determining the position of the fetch arm and outputting corresponding signals to a microcontroller connected to an optical type vacuum release controller which provides a signal to a vacuum solenoid valve so that the vacuum in the suction head is released just prior to insertion of the wafer into the cassette holder;

wherein the sensors comprise:
- a first sensor for sensing whether the fetch arm is in a first position and outputting a first sensor signal to the microcontroller indicating whether the fetch arm is in the first position or not;
- a second sensor for sensing whether the fetch arm is in a second position and outputting a second sensor signal to the microcontroller indicating whether the fetch arm is in the second position or not; and wherein the microcontroller, after receiving the first and second sensor signals from the first and second sensors, generates a first control signal.

2. The controlling system of claim 1, wherein the optical type vacuum release controller, after receiving a first control signal from the microcontroller and the first and second sensor signals from the first and second sensors, generates a second control signal.

3. The controlling system of claim 2, wherein the suction head releases the vacuum in response to either a second control signal at logic low or a combination of a second control signal at logic high and a first control signal at logic low and the suction head maintains the vacuum in response to a combination of a second control signal at logic high and a first control signal at logic high.

4. A controlling system for a fetch arm of a stepper for reducing scratching of a wafer being inserted into a cassette holder and held by a vacuum to a suction head of the fetch arm, comprising:
- a first sensor for sensing whether the fetch arm is in a first position and outputting a first sensor signal indicating whether the fetch arm is in the first position or not;
- a second sensor for sensing whether the fetch arm is in a second position and outputting a second sensor signal indicating whether the fetch arm is in the second position or not;
- a microcontroller for receiving the first and second sensor signals and generating a first control signal;
- an optical type vacuum release controller for receiving the first control signal, the first and second sensor signals and generating internally a second control signal; and
- a vacuum solenoid valve controlled by the vacuum release controller for releasing or holding a vacuum in the suction head of a fetch arm.

5. The controlling system of claim 4 wherein the first sensor signal comprises: a logic high signal when the fetch arm is in the first position; and a logic low signal when the fetch arm is not in the first position.

6. The controlling system of claim 4 wherein the second sensor signal comprises: a logic low signal when the fetch arm is in the second position; and a logic high signal when the fetch arm is not in the second position.

7. The controlling system of claim 6, wherein the suction head releases the vacuum in response to either a second control signal at logic low or a combination of a second control signal at logic high and a first control signal at logic low and the suction head maintains the vacuum in response to a combination of a second control signal at logic high and a first control signal at logic high.

8. The controlling system of claim 4, wherein the vacuum release controller comprises:
- a first signal delaying circuit for delaying a rising edge of the incoming first sensor signal for a first prescribed period so that a corresponding delayed signal is output in response to varying speeds of the fetch arm, thereby ensuring the release of the vacuum before the wafer enters the cassette holder;
- a second signal delaying circuit for delaying a falling edge of the second sensor signal for a second prescribed period so that vacuum release does not cease before the fetch arm has reached the second position;
- a timing control circuit for receiving the output from the first signal delaying circuit and the second signal delaying circuit, and then generating a second control signal; and
- an opto-isolated electronic switching circuit, using the first control signal and the second control signal to control the vacuum solenoid valve, thereby controlling the vacuum releasing and vacuum holding sequence in the suction head of the fetch arm.

9. The controlling system of claim 8, wherein the timing control circuit is a D-type flip-flop, which uses the output from the first signal delaying circuit as a clock signal and the output from the second signal delaying circuit as a clear signal, and which include a complementary output terminal which is coupled to an input terminal of the flip-flop, the complementary output terminal serving as an output for the second control signal.

10. A vacuum release controller inside a fetch arm controlling system of a stepper that is capable of reducing scratching of a wafer being inserted into a cassette holder and held by the fetch arm having a suction head which produces and releases a vacuum in response to signals from the fetch arm controlling system, the vacuum release controller comprising:
- a first signal delaying circuit for delaying a rising edge of an input signal from a first sensor for a first prescribed period before outputting a first delayed signal, which first sensor detects a first position of the fetch arm;
- a second signal delaying circuit for delaying a falling edge of an input signal from a second sensor for a second prescribed period before outputting a second delayed signal, which second sensor detects a second position of the fetch arm;
- a timing control circuit coupled to the first and second signal delaying circuits for receiving the first and second delayed signals to generate a second control signal, wherein the timing control circuit is a D-type flip-flop, which uses the output from the first delayed signal as a clock signal and the second delayed signal as a clear signal, and which include a complementary output terminal coupled to an input terminal of the flip-flop, the complementary output terminal serving as an output for the second control signal; and
- an opto-isolated electronic switching circuit coupled to the timing control circuit and the vacuum solenoid valve, for receiving the second control signal and a first control signal generated by the microcontroller to control the vacuum solenoid valve, thereby controlling the sequence of vacuum releasing and vacuum holding actions in the suction head of a fetch arm; wherein
   the second control signal releases the vacuum from the end of the first prescribed period when the fetch arm starts moving away from the first position until the end of the second prescribed period when the fetch arm arrives in the second position.

* * * * *